US008198736B2

(12) United States Patent
Henderson et al.

(10) Patent No.: US 8,198,736 B2
(45) Date of Patent: Jun. 12, 2012

(54) REDUCED SUSCEPTIBILITY TO ELECTROSTATIC DISCHARGE DURING 3D SEMICONDUCTOR DEVICE BONDING AND ASSEMBLY

(75) Inventors: Brian M. Henderson, Escondido, CA (US); Reza Jalilizeinali, Oceanside, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 412 days.

(21) Appl. No.: 12/421,096

(22) Filed: Apr. 9, 2009

(65) Prior Publication Data

US 2010/0258949 A1 Oct. 14, 2010

(51) Int. Cl.
*H01L 23/48* (2006.01)
*H01L 23/52* (2006.01)
*H01L 29/40* (2006.01)

(52) U.S. Cl. ........................................ 257/778
(58) Field of Classification Search ............ 257/777, 257/778
See application file for complete search history.

(56) References Cited

U.S. PATENT DOCUMENTS

| 7,535,105 | B2 | 5/2009 | Voldman |
| 7,902,668 | B2 | 3/2011 | Sato |
| 2003/0218235 | A1* | 11/2003 | Searls et al. .............. 257/532 |
| 2007/0029646 | A1 | 2/2007 | Voldman |
| 2008/0230903 | A1 | 9/2008 | Sato |
| 2011/0089561 | A1 | 4/2011 | Kurita et al. |
| 2011/0204504 | A1 | 8/2011 | Henderson et al. |

FOREIGN PATENT DOCUMENTS

EP 1617473 1/2006

OTHER PUBLICATIONS

International Search Report and Written Opinion—PCT/US2010/030577, International Search Authority—European Patent Office—Jul. 5, 2010.
Matthias T et al: "3D process integration. Wafer-to-wafer and chip-to-wafer bonding" Enabling Technologies for 3-D Integration Symposium—Nov. 27-29, 2006, pp. 231-237, XP009104011 p. 232-p. 233.

* cited by examiner

*Primary Examiner* — Jenny L Wagner
(74) *Attorney, Agent, or Firm* — Michelle Gallardo; Nicholas J. Pauley; Jonathan T. Velasco

(57) ABSTRACT

A method to reduce electrostatic discharge susceptibility when assembling a stacked IC device. The method includes coupling a ground plane of a first semiconductor device and a ground plane of a second semiconductor device to substantially a same electrical potential. Active circuitry on the first semiconductor device and active circuitry on the second semiconductor device are electrically coupled after the ground planes are coupled. Electrically coupling the ground planes of the first and the second semiconductor device creates a preferred electrostatic discharge path to ground, thus minimizing potential damage to sensitive circuit elements.

13 Claims, 5 Drawing Sheets

REDUCED SUSCEPTIBILITY TO ELECTROSTATIC DISCHARGE DURING 3D SEMICONDUCTOR DEVICE BONDING AND ASSEMBLY

TECHNICAL FIELD

The present disclosure generally relates to semiconductor device assembly. More specifically, the present disclosure relates to reducing electrostatic discharge susceptibility in stacked IC device assembly.

BACKGROUND

A 3D semiconductor device (or stacked IC device) can contain two or more semiconductor devices stacked vertically so they occupy less space than two or more conventionally arranged semiconductor devices. The stacked IC device is a single integrated circuit built by stacking silicon wafers and/or ICs and interconnecting them vertically so that they behave as a single device.

Conventionally, the stacked semiconductor devices are wired together using input/output ports either at the perimeter of the device or across the area of the device or both. The input/output ports slightly increase the length and width of the assembly. In some new 3D stacks, through-silicon vias (TSVs) completely or partly replace edge wiring by creating vertical connections through the body of the semiconductor device. By using TSV technology, stacked IC devices can pack a great deal of functionality into a small footprint. This TSV technique is sometimes also referred to as TSS (Through Silicon Stacking). Furthermore, critical electrical paths through the device can be drastically shortened, reducing capacitance and resistance and therefore improving power dissipation, and performance.

Assembly and packaging of semiconductor devices should take into account the adverse affects of electrostatic discharge. Conventionally, there are several ways of reducing ESD. One is to provide proper grounding of assembly equipment parts to prevent charge buildup that may result in discharge capable of destroying circuit components, such as transistors. A second is use of ionized air-flow to reduce charge build-up on the ICs and the assembly fixtures. Another way is to eliminate or reduce ESD damage by providing ESD protection circuitry on the semiconductor device.

However, in stacked IC device assembly and connection, to maximize the density of connections and reduce electrical parasitics, circuit-level ESD protection is reduced or eliminated. The semiconductor devices may then be more susceptible to damage from ESD during assembly. The same ESD susceptibility concerns apply whether the assembly process is chip-to-chip (i.e., IC-to-IC) or chip to wafer (i.e., IC-to-wafer) or wafer to wafer. Therefore, there is a need to develop methods and structures to enable the assembly of stacked IC devices with reduced sensitivity to ESD when protection circuitry is not included in every individual IC or wafer.

BRIEF SUMMARY

A method to reduce electrostatic discharge when assembling a stacked IC device includes coupling a voltage reference plane, usually the ground plane or body, of a first semiconductor device and a voltage reference plane, usually the ground plane or body of a second semiconductor device to substantially the same electrical potential. Active circuitry on the first semiconductor device and active circuitry on the second semiconductor device are electrically coupled after the ground planes are coupled. Electrically coupling the ground planes of the first and the second semiconductor device creates an electrostatic discharge path to ground, thus reducing potential damage to sensitive circuit elements.

A system to assemble stacked IC devices with reduced electrostatic discharge (ESD) susceptibility includes a movable pick-and-place (PnP) chuck configured to carry at least a first semiconductor device containing one or more integrated circuits. The first semiconductor device includes a ground plane and active circuitry. A movable PnP head is configured to carry a second semiconductor device. The second semiconductor device includes a ground plane and active circuitry. The system is configured to electrically couple the ground planes of the first and second semiconductor devices to substantially a same electrical potential prior to electrically coupling the active circuitry of the first and second semiconductor devices.

A first semiconductor device for assembly with a second semiconductor device to create a stacked IC device includes a conductive pad coupled to a ground plane of the first semiconductor device. The conductive pad enables placing the ground plane of the first semiconductor device and the ground plane of the second semiconductor device at substantially a same electrical potential before electrical coupling the active circuitry of the first and second semiconductor devices.

In another embodiment, a first semiconductor device for assembly with a second semiconductor device to create a stacked IC device includes at least one conductive pad. The pad(s) is coupled to a ground plane of the first semiconductor device enabling placing the ground plane of the first semiconductor device and the ground plane of the second semiconductor device at substantially a same electrical potential before coupling an active circuit on the first semiconductor device to an active circuit on the second semiconductor device of the stacked IC device.

In still another embodiment, a first semiconductor device for assembly with a second semiconductor device to create a stacked IC device includes means for reducing susceptibility to electrostatic discharge (ESD) coupled to a ground plane of the first semiconductor device. The reducing means enables placing of the ground plane of the first semiconductor device and a ground plane of the second semiconductor device at substantially a same electrical potential before coupling active circuitry of the first semiconductor device to active circuitry of the second semiconductor device.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other embodiments for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
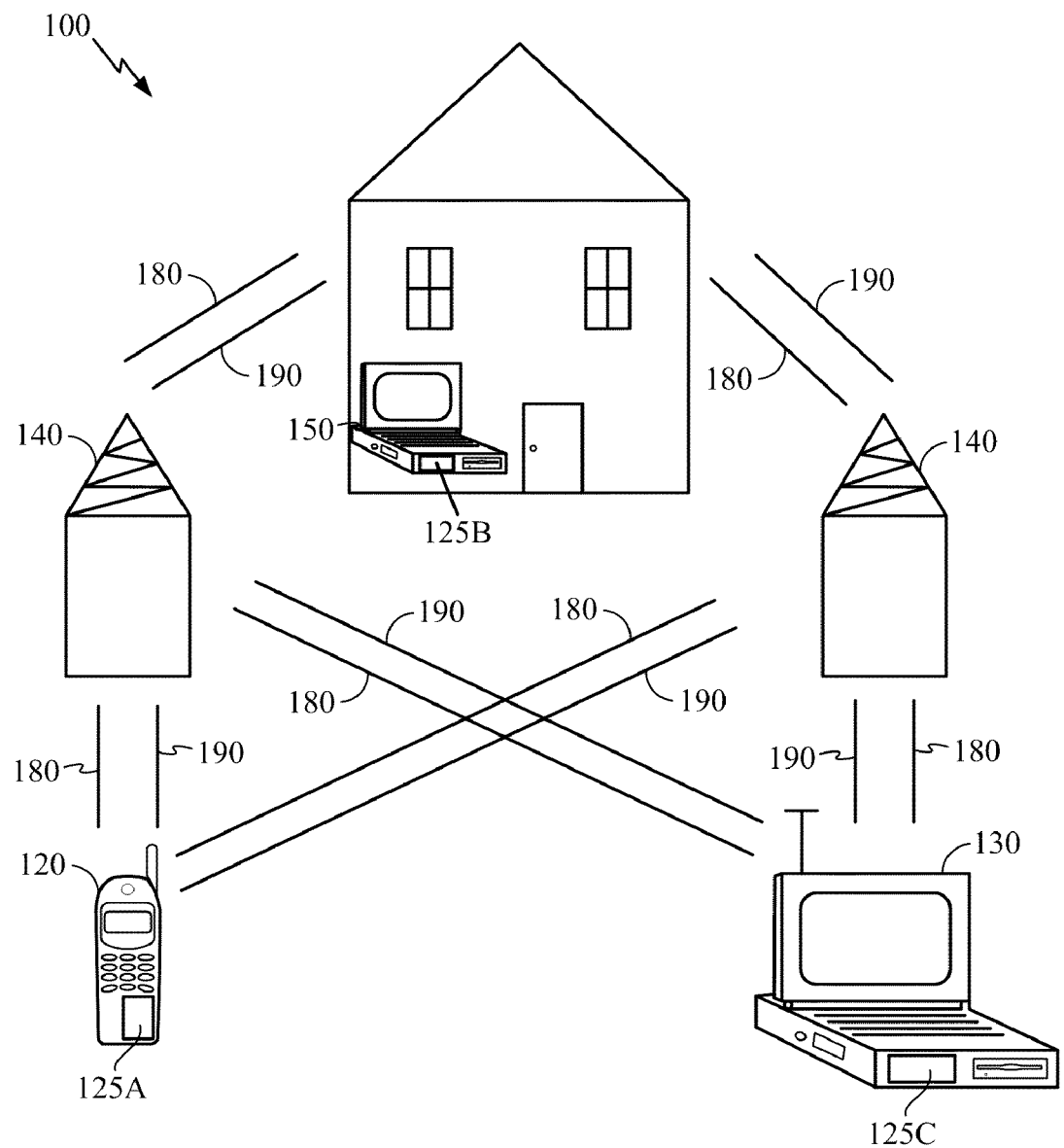
FIG. 1 is a block diagram showing an exemplary wireless communication system in which an embodiment of the disclosure may be advantageously employed.

FIG. 1 shows an exemplary communication system 100 in which an embodiment of the disclosure may be advantageously employed. For purposes of illustration, FIG. 1 shows three remote units 120, 130, and 150 and two base stations 140. It will be recognized that conventional communication systems may have many more remote units and base stations. Remote units 120, 130, and 150 include 3D stacked semiconductor devices 125A, 125B and 125C, which are embodiments of the disclosure as discussed further below. FIG. 1 shows forward link signals 180 from the base stations 140 and the remote units 120, 130, and 150 and reverse link signals 190 from the remote units 120, 130, and 150 to base stations 140.

In FIG. 1, remote unit 120 is shown as a mobile telephone, remote unit 130 is shown as a portable computer, and remote unit 150 is shown as a fixed location remote unit. For example, the remote units may be cell phones, hand-held personal communication systems (PCS) units, portable data units such as personal data assistants, or fixed location data units such as meter reading equipment. Although FIG. 1 illustrates remote units according to the teachings of the disclosure, the disclosure is not limited to these exemplary illustrated units. Embodiments of the disclosure may be suitably employed in any device which includes stacked IC devices.

Figure 2:
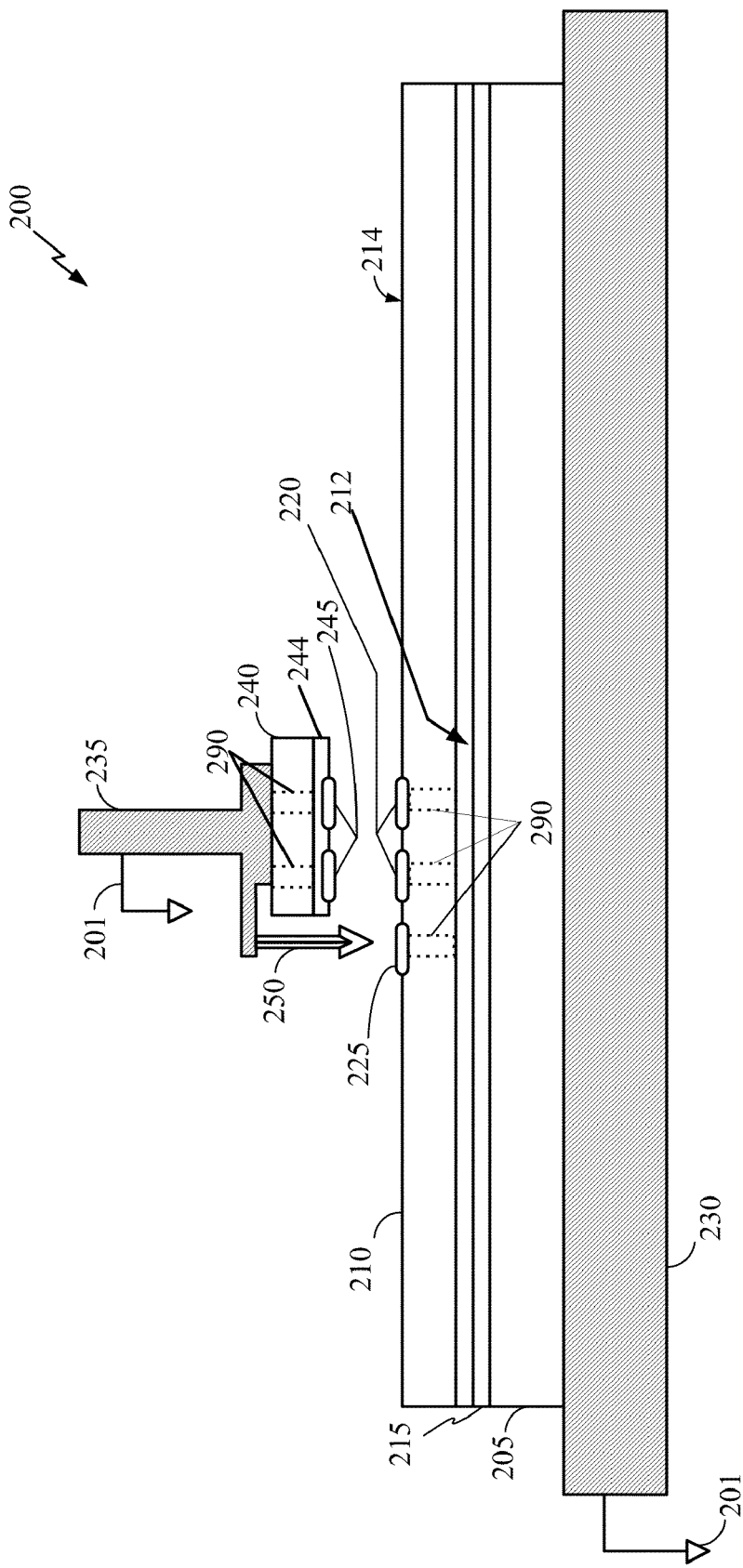
FIG. 2 is an illustration of an embodiment of a system for assembling stacked IC devices.

FIG. 2 shows an embodiment of a system 200 for assembling integrated circuits in 3D in accordance with the disclosure. The system 200 includes a carrier 205 on which is placed a first semiconductor device 210. A temporary adhesive 215 may be used to affix the first semiconductor device 210 to the carrier 205. The first semiconductor device 210 may be a wafer or an IC. The first semiconductor device 210 includes active circuitry (not shown) on an active face 212, and a ground plane (not shown). The first semiconductor device 210 may be placed on the carrier 205 with the active face 212 toward and contacting the carrier 205 or the temporary adhesive 215. Alternatively, the back face 214 faces and contacts the carrier 205 or temporary adhesive 215. In FIG. 2, the active face 212 is shown facing the carrier 205.

In either alternative arrangement, at least one conductive pad 225 (e.g., a micro-bump) can be placed on the side of the first semiconductor device 210 not facing the carrier 205. The conductive pad 225 is in electrical contact with the ground plane of the semiconductor device 210. The ground plane and the conductive pad 225 provide low resistance paths to reduce an electrical potential that may occur, thus reducing the likelihood of electrostatic discharge damage to active circuitry. In one embodiment, the conductive pad 225 is provided in a scribe line.

The first semiconductor device 210 may have additional low resistance conductive pads 220 for electrical connections to the active circuitry. In case the ground plane and/or active circuitry are located on the opposite sides of the first semiconductor device 210 from the conductive pads 220, 225, optional through silicon vias (TSVs 290) can be used to provide low resistance electrical connections between the conductive pads 220, 225 to the respective ground plane and active circuitry on the opposite side of the first semiconductor device 210. Although the terminology "through silicon via" includes the word silicon, it is noted that through silicon vias are not necessarily constructed in silicon. Rather, the material can be any device substrate material.

The carrier 205 can be placed on a movable pick-and-place (PnP) chuck 230 (i.e., PnP chuck 230), which is electrically conductive, i.e., is a low resistance path. Furthermore, the PnP chuck 230 can be connected to a common electrical ground 201.

In an embodiment, the system 200 can further include a conductive movable PnP head 235 electrically connected to provide a low resistance path to the same common electrical ground 201 as the PnP chuck 230. The PnP head 235 carries a second semiconductor device 240 having a ground plane (not shown) and active circuitry 244. The second semiconductor device 240 may be an IC. The orientation of the second semiconductor device 240 can result in an active face 244 facing the first semiconductor device 210 (as shown in FIG. 2) or, alternatively, facing the PnP head 235. In either embodiment, the PnP head 235 is in electrical communication with the ground plane of the second semiconductor device 240 to place the ground plane of the second semiconductor device 240 at substantially the same electrical potential as the PnP head 235 by direct contact, or by one or more optional TSVs 290 to the opposite side of the second semiconductor device 240. The PnP head 235 is coupled to the common electrical ground 201, and therefore is also at substantially the same electrical potential as the PnP chuck 230 and the ground plane of the second semiconductor device 240.

The second semiconductor device 240 has low resistance conductive pads 245 electrically connected to active circuitry that are brought into electrical connection with active circuitry on the first semiconductor device 210 when contacted to the corresponding conductive pads 220 during assembly.

The PnP head 235 head includes a low resistance electrical contact probe 250 to electrically couple to the conductive pad 225 on the first semiconductor device 210 as the PnP head 235 is moved to position the second semiconductor device 240 for assembly to the first semiconductor device 210. The contact probe 250 contacts the conductive pad 225 before the conductive pads 245 contact the corresponding conductive pads 220, reducing susceptibility to ESD. The contact probe 250 may be, for example, a spring loaded pogo pin, or an equivalent. This ensures that the ground planes of the first semiconductor device 210 and the second semiconductor device 240 achieve substantially the same electrical potential before the active circuitry of the first semiconductor device 210 and the second semiconductor device 240 are brought into electrical communication. Various combination of the conductive pad 225, optional TSVs 290 (depending on the first semiconductor device orientation), the grounded PnP chuck 230, the grounded PnP head 235 and the contact probe 250 may be used in suitable embodiments to ensure that the first semiconductor device ground plane is at substantially the same electrical potential as the ground plane of the second semiconductor device 240 prior to final chip-to-wafer or chip-to-chip assembly.

As shown in FIG. 2, the second semiconductor device 240 is held on the PnP head 235 so that the active face 244 will contact the back face 214 of the first semiconductor device 210 when assembled. The system 200 may also be used to assemble semiconductor devices in 3D with the active faces 212 and 244 facing each other for assembly. The TSVs 290 may be included to connect the ground plane to the PnP head 235 from the opposite side of the semiconductor device 240 if the ground plane is located on the opposite side from the PnP head 235.

In some embodiments, for example where the first semiconductor device 210 is a wafer, the ground plane conductive pad 225 may be disposed in a scribe lane.

Figure 3:
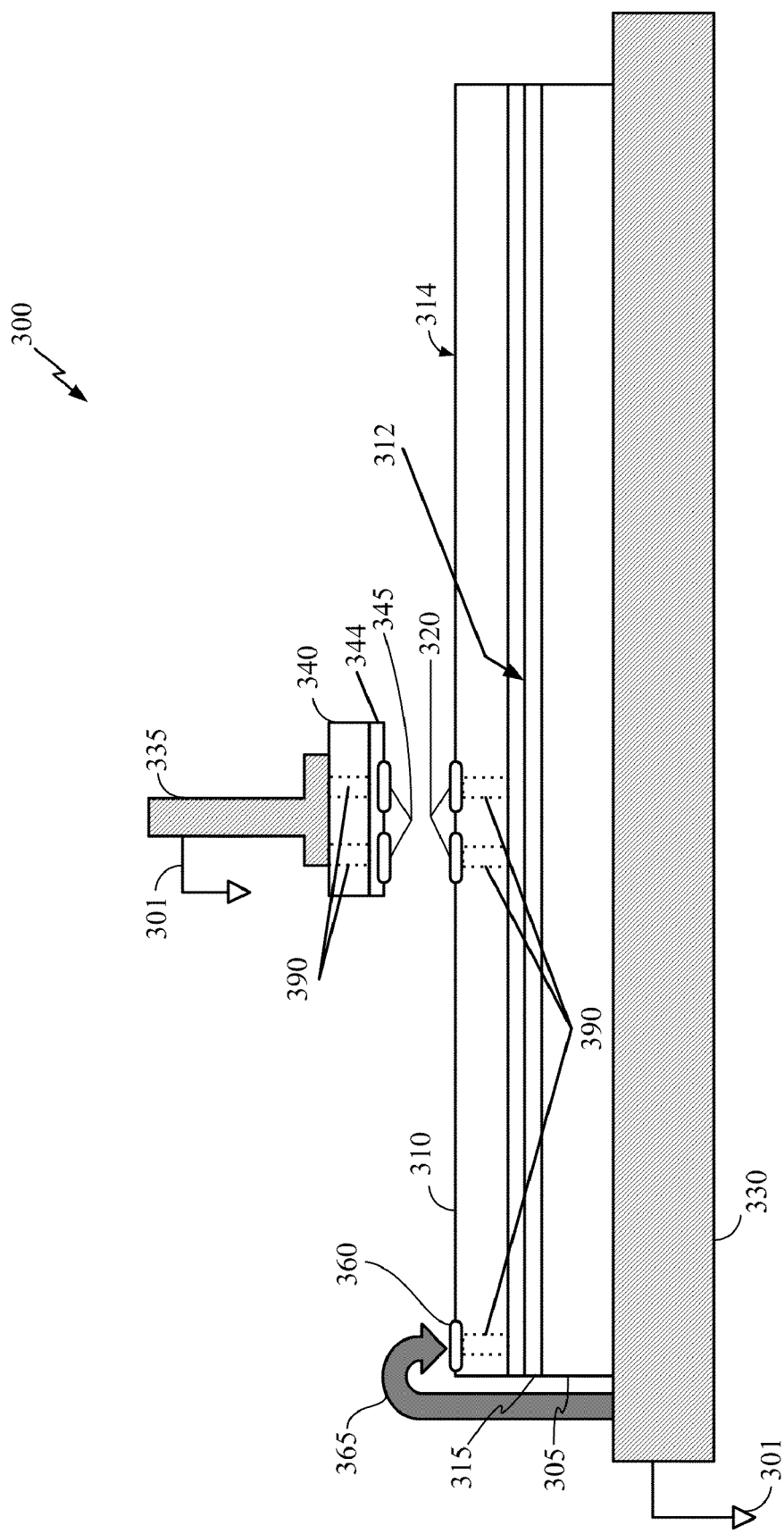
FIG. 3 is an illustration of a second embodiment of a system for assembling stacked IC devices.

FIG. 3 shows an embodiment of a system 300 for assembling integrated circuits in 3D in accordance with the disclosure. Several elements are identical to those described in FIG. 2, and will not be discussed in detail.

The system 300 differs from the system 200 because the system 300 includes a PnP head 335 holding a second semiconductor device 340 that differs from the PnP head 235 of the system 200 by not including the contact probe 250. Instead, a low resistance wafer conductive edge clip 365 makes an electrical connection between a PnP chuck 330 and a conductive pad 360 on the upward facing surface of a first semiconductor device 310, shown as a back face 314 in FIG. 3. The conductive pad 360 is in electrical communication with the ground plane (not shown) of the first semiconductor device 310. The conductive pad 360 may be located, for example, in a scribe line of the first semiconductor device 310. If the first semiconductor device 310 is a wafer, the conductive pad 360 electrically couples to and "shorts" the ground planes of all die in the wafer.

When the ground plane of the first semiconductor device 310 is on the same surface as the conductive pad 360, a TSV 390 is not used. When the ground plane of the first semiconductor device 310 is on the opposite side, at least one TSV 390 may be used to couple the conductive pad 360 to the ground plane. As in the system 200, all conductive pads, ground planes and TSVs are low resistance paths.

When contact is made between the wafer conductive edge clip 365 and the conductive pad 360, the ground plane of the first semiconductor device 310 is then substantially grounded to the PnP chuck 330, which is also at the same potential as the PnP head 335, similar to the PnP head 235 of the embodiment of the system 200. When contact is made between the conductive edge clip 365 and the conductive pad 360, there is a reduced susceptibility to ESD. In case the semiconductor device 310 is placed on a carrier 305 with the active face 312 downward, i.e., toward the carrier 305, the conductive pads 320 may be in electrical communication with the active circuitry on the active face 312 via at least one TSV 390.

The structure of the system 300 thus establishes electrical communication between the ground planes of both the first semiconductor device 310 and the second semiconductor device 340 to place them at substantially the same electrical potential before electrical contact is actually made between the active circuitry of the first semiconductor device 310 and the second semiconductor device 340.

It can be appreciated that, from geometrical considerations, the system 300 is appropriate for a chip-to-wafer configuration (i.e., where the first semiconductor device 310 is a wafer, and the second semiconductor device 340 is an IC, i.e., a chip, or die). Two wafers of the same dimensions may not be stacked in this manner, due to the location of the wafer conductive edge clip 365. Alternatively, the first semiconductor device 310 may be an IC of larger dimension than the second semiconductor device 340 in order to provide an exposed location for the wafer conductive edge clip 365 to contact the conductive pad 360.

The system 300 has a common electrical ground 301, a temporary adhesive 315, an active face 344, and active circuit conductive pads 345, in correspondence with similar structures shown in FIG. 2.

Figure 4:
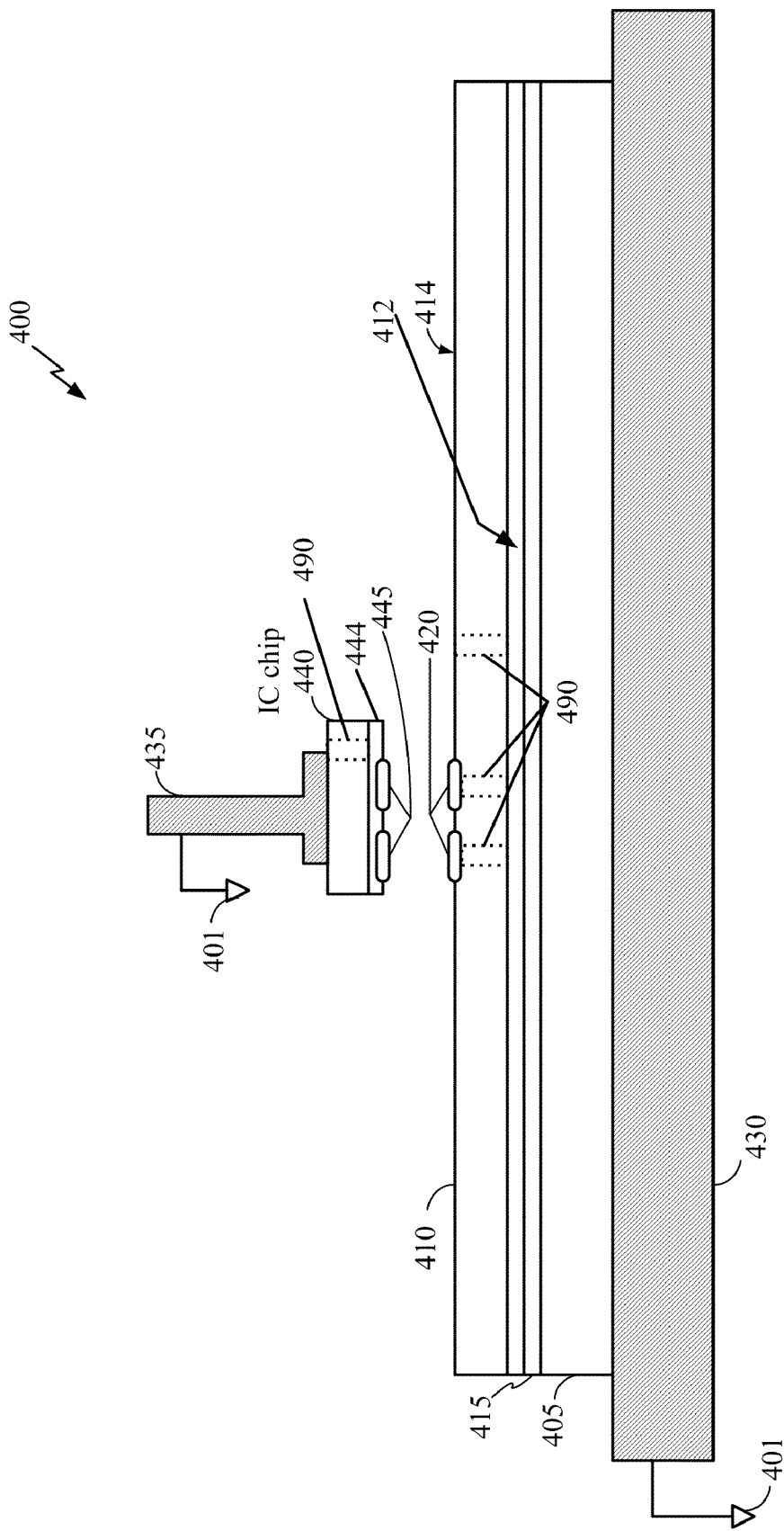
FIG. 4 is an illustration of a third embodiment of a system for assembling stacked IC devices.

FIG. 4 shows an embodiment of a system 400 for assembling ICs in 3D in accordance with the disclosure. Many elements are identical to those described in FIG. 2 and/or FIG. 3, and will not be discussed in detail.

The system 400 differs from the system 200 and/or the system 300 in the following respects: The system 400 may not include the wafer conductive edge clip 365 and the conductive pad 360 of the system 300 of FIG. 3, or the contact probe 250 to make an electrical connection to the conductive pad 225, as in the system 200 of FIG. 2. Instead, an electrically conductive temporary adhesive 415 and a conductive carrier 405 provide a conductive path between the ground plane of a first semiconductor device 410 and a PnP chuck 430 to reduce susceptibility to ESD. As in the systems 200 and 300, a PnP head 435, holding a second semiconductor device 440, and the PnP chuck 430, holding the conductive carrier 405, are coupled to a common ground 401. Therefore, the respective ground planes of a first semiconductor device 410 and the second semiconductor device 440 are brought to substantially a same electrical potential before respective conductive pads 420 and 445 are electrically connected in the assembly process to electrically couple the active circuitry of the first semiconductor device 410 and the second semiconductor device 440.

As shown in FIG. 4, an active face 444 of the second semiconductor device 440 includes the conductive pads 445 and is positioned to assemble to a back face 414 of the first semiconductor device 410. However, the first semiconductor device 410 may be alternatively configured on the conductive carrier 405 to have the active face 412 facing the second semiconductor device 440. The conductive pads 420 and 445 may be disposed on the facing sides of the first semiconductor device 410 and the second semiconductor device 440, respectively, to enable electrical connection between the respective active circuitry. Where desired, the TSVs 490 may be included to provide electrical connection to the opposite side of either or both the first semiconductor device 410 and the second semiconductor device 440, as previously described.

Figure 5:
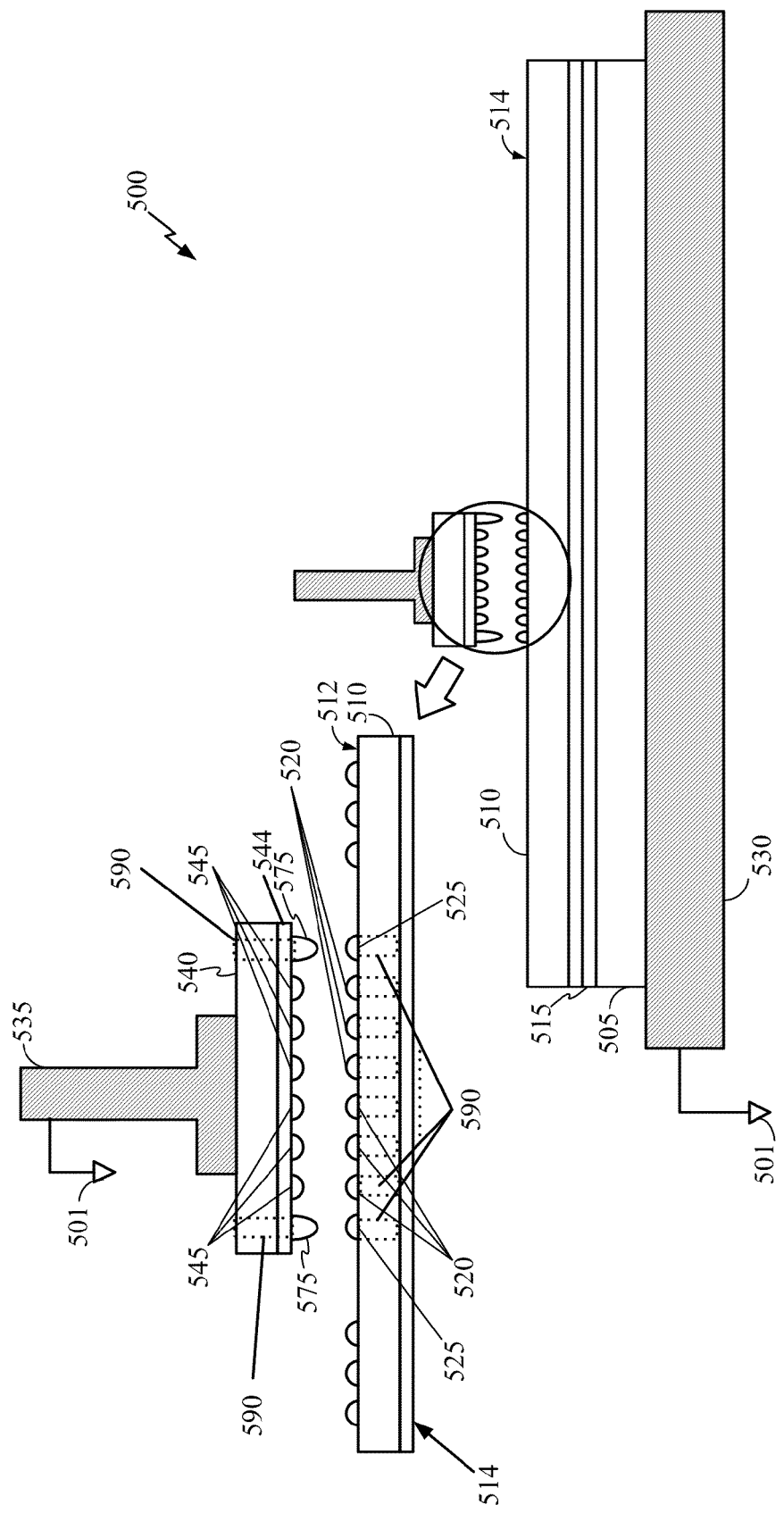
FIG. 5 is an illustration of a fourth embodiment of a system for assembling stacked IC devices.

FIG. 5 shows an embodiment of a system 500 for assembling semiconductor devices in 3D in accordance with the disclosure. Many elements are substantially identical or similar to those described in FIGS. 2, 3 and/or 4, and will not be discussed in detail.

The system 500 is adapted to assemble a second semiconductor device 540 to a first semiconductor device 510. Active circuitry conductive pads 520 in electrical communication with active circuitry on an active face 514 and ground plane conductive pads 525 in electrical communication with a ground plane on the first semiconductor device 510 may be micro-bumps, for example. Similarly, the second semiconductor device 540 includes active circuitry conductive pads 545 (that may also be micro-bumps) in electrical communication with active circuitry on an active face 544 of the second semiconductor device 540. The active circuitry conductive pads 545 come in contact with the corresponding active circuitry conductive pads 520 (or micro-bumps) on the first semiconductor device 510 in the course of assembly.

The second semiconductor device 540 also includes ground plane conductive pads 575 in electrical communication with the ground plane of the second semiconductor device 540. The ground plane conductive pads 575 may be low resistance micro-bumps that are larger (e.g., taller if the dies are stacked in a horizontal configuration, as shown) than the active circuitry conductive pads 545. The ground plane conductive pads 575 will come in physical and electrical contact with the ground plane conductive pads 525 before the active circuitry conductive pads 520 and 545 make contact to reduce the susceptibility to ESD. That is, the ground planes of both semiconductor devices 510, 540 are electrically coupled to substantially the same potential before the active circuitry conductive pads 520 and 545 make electrical contact between the active circuitry on the first semiconductor device 510 and the active circuitry of the second semiconductor device 540. Alternatively, the ground plane conductive pads 525 may be larger (e.g., taller) micro-bumps, or both the ground plane conductive pads 575 and 525 may be larger (e.g., taller) micro-bumps than the active circuitry conductive pads 520, 545.

A PnP chuck 530 and a PnP head 535 are coupled to a common ground 501, as described above for systems 200, 300 and 400. The ground plane of the second semiconductor device 540 is in electrical communication with the PnP head 535, and is therefore at substantially the same common ground 501, i.e., electrical potential. TSVs 590 are used in the second semiconductor device 540 if the ground plane is on the opposite side of the second semiconductor device 540 that is facing the PnP head 535. A carrier 505 and a temporary adhesive 515 may be conductive or, alternatively, either or both may be non-conductive. Regardless, it may be appreciated that the ground planes of the first semiconductor device 510 and the second semiconductor device 540 can be brought to substantially the same electrical potential before active circuitry on the first semiconductor device 510 and the second semiconductor device 540 are electrically connected as a result of the assembly.

The various paths connecting wafers, carrier, head, chuck, etc. may result in the ground planes of the stacked semiconductor devices being assembled so that electrical potentials vary because of finite resistance. In that case, a threshold potential difference may be selected as a limit above which an unacceptable amount of damage to the active circuitry may potentially occur.

Although the present disclosure and its advantages have been described in detail, it should be understood that various changes, substitutions and alterations can be made herein without departing from the intent of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A first semiconductor device for assembly with a second semiconductor device to create a stacked IC device, the first semiconductor device comprising:
   at least one ground plane conductive pad coupled to a ground plane of the first semiconductor device, and
   active circuitry conductive pads coupled to active circuitry disposed within an active face of the first semiconductor device,
   the at least one ground plane conductive pad being electrically insulated from the active circuitry disposed within the active face of the first semiconductor device and configured to provide an electrostatic discharge path to ground,
   the active circuitry conductive pads being configured to couple to circuitry disposed within an active face of the second semiconductor device of the stacked IC device.

2. The first semiconductor device of claim 1, in which the at least one ground plane conductive pad of the first semiconductor device is configured to be contacted by a contact probe of a pick-and-place (PnP) head to provide the electrostatic discharge path to ground.

3. The first semiconductor device of claim 2, in which the first semiconductor device is a wafer and the second semiconductor device is a chip.

4. The first semiconductor device of claim 2, in which the first semiconductor device is a chip and the second semiconductor device is a chip.

5. The first semiconductor device of claim 1, in which the at least one ground plane conductive pad on the first semiconductor device is configured to be contacted by a conductive edge clip of a pick-and-place (PnP) chuck to provide the electrostatic discharge path to ground.

6. The first semiconductor device of claim 5, in which the first semiconductor device comprises a wafer, and the at least one conductive pad is coupled to ground planes of a plurality of chips on the wafer.

7. The first semiconductor device of claim 1, in which the at least one ground plane conductive pad of the first semiconductor device is configured to be contacted by a ground plane conductive pad of the second semiconductor device, to provide the electrostatic discharge path to ground.

8. The first semiconductor device of claim 7, in which the at least one ground plane conductive pad of the first semiconductor device is larger than the active circuitry conductive pads on the first semiconductor device.

9. The first semiconductor device of claim 1, in which the at least one ground plane conductive pad is provided in a scribe lane.

10. The first semiconductor device of claim 1, in which at least one of the first and second semiconductor devices does not include ESD protection circuitry.

11. A first semiconductor device for assembly with a second semiconductor device to create a stacked IC device, the first semiconductor device comprising:
    active circuitry conductive pads coupled to active circuitry disposed within an active face of the first semiconductor device, the active circuitry conductive pads being configured to couple to active circuitry disposed within an active face of the second semiconductor device; and
    means for providing an electrostatic discharge (ESD) path to ground coupled to a ground plane and being electrically insulated from the active circuitry disposed within an active face of the first semiconductor device.

12. The stacked device of claim 11, incorporated into at least one of a music player, a video player, an entertainment unit, a navigation device, a communications device, a personal digital assistant (PDA), a fixed location data unit, and a computer.

13. The stacked IC device of claim 1, incorporated into at least one of a music player, a video player, an entertainment unit, a navigation device, a communications device, a personal digital assistant (PDA), a fixed location data unit, and a computer.

* * * * *